United States Patent
Hsiao

(10) Patent No.: US 10,628,082 B2
(45) Date of Patent: Apr. 21, 2020

(54) DATA READING METHOD AND STORAGE CONTROLLER

(71) Applicant: SHENZHEN EPOSTAR ELECTRONICS LIMITED CO., Shenzhen (CN)

(72) Inventor: Yu-Hua Hsiao, Hsinchu County (TW)

(73) Assignee: SHENZHEN EPOSTAR ELECTRONICS LIMITED CO., Shenzhen (CN)

(*) Notice: Subject to any disclaimer, the term of this patent is extended or adjusted under 35 U.S.C. 154(b) by 53 days.

(21) Appl. No.: 15/937,863

(22) Filed: Mar. 28, 2018

(65) Prior Publication Data

US 2019/0095135 A1  Mar. 28, 2019

(30) Foreign Application Priority Data

Sep. 26, 2017  (TW) .............................. 106133020 A

(51) Int. Cl.
| | |
|---|---|
| G06F 3/06 | (2006.01) |
| G11C 16/26 | (2006.01) |
| G11C 11/56 | (2006.01) |
| G11C 16/34 | (2006.01) |
| G11C 29/02 | (2006.01) |
| G11C 16/04 | (2006.01) |

(52) U.S. Cl.
CPC .......... *G06F 3/0659* (2013.01); *G06F 3/0604* (2013.01); *G06F 3/0679* (2013.01); *G11C 11/5642* (2013.01); *G11C 16/26* (2013.01); *G11C 16/3495* (2013.01); *G11C 29/021* (2013.01); *G11C 29/028* (2013.01); *G11C 11/5671* (2013.01); *G11C 16/0483* (2013.01)

(58) Field of Classification Search
None
See application file for complete search history.

(56) References Cited

U.S. PATENT DOCUMENTS

| | | |
|---|---|---|
| 9,711,231 B1 | 7/2017 | Yip et al. |
| 9,715,429 B1 | 7/2017 | Lin |
| 2010/0020611 A1* | 1/2010 | Park .................... G06F 11/1068 |
| | | 365/185.09 |

(Continued)

FOREIGN PATENT DOCUMENTS

TW    I592869    7/2017

OTHER PUBLICATIONS

"Office Action of Taiwan Counterpart Application", dated Mar. 13, 2018, p. 1-p. 5.

*Primary Examiner* — Edward J Dudek, Jr.
*Assistant Examiner* — Ralph V Verderamo, III
(74) *Attorney, Agent, or Firm* — JCIPRNET

(57) ABSTRACT

A data reading method and a storage controller for a rewritable non-volatile memory module are provided. The method includes identifying a plurality of preset bit values corresponding to a plurality of first memory cells of a first physical unit; reading the first memory cells by respectively using a plurality of preset read voltages to obtain a plurality of read bit values corresponding to the first memory cells; adjusting the preset read voltages based on the identified preset bit values and the read bit values corresponding to the first memory cells to obtain a plurality of optimized read voltages; and executing a read command sequence on the first physical unit by using the optimized read voltages.

8 Claims, 8 Drawing Sheets

(56) References Cited

U.S. PATENT DOCUMENTS

2014/0095110 A1* 4/2014 Chen .................... G11C 29/028
                                                            702/179
2015/0006983 A1* 1/2015 Lin .................. G11C 29/50004
                                                            714/721

* cited by examiner

| Memory cells | | S1 | S2 | S3 | S4 | S5 | S6 | S7 | S8 | Storage statuses |
|---|---|---|---|---|---|---|---|---|---|---|
| | Lower physical page (L) | 1 | 1 | 1 | 1 | 0 | 0 | 0 | 0 | |
| | Middle physical page (M) | 1 | 1 | 0 | 0 | 0 | 0 | 1 | 1 | |
| | Upper physical page (U) | 1 | 0 | 0 | 1 | 1 | 0 | 0 | 1 | |
| Direction of first displacement | | ↑ | ↑ | ↑ | ↑ | ↑ | ↑ | ↑ | ↑ | |
| Number of storage statuses of lower physical pages of memory cells with first displacement (NL1) | | -- | -- | -- | A | -- | -- | -- | -- | |
| Number of storage statuses of middle physical pages of memory cells with first displacement (NM1) | | -- | B | -- | -- | -- | C | -- | -- | |
| Number of storage statuses of upper physical pages of memory cells with first displacement (NU1) | | D | -- | E | -- | F | -- | G | -- | |
| Direction of second displacement | | ↓ | ↓ | ↓ | ↓ | ↓ | ↓ | ↓ | ↓ | |
| Number of storage statuses of lower physical pages of memory cells with second displacement (NL2) | | -- | -- | -- | -- | H | -- | -- | -- | |
| Number of storage statuses of middle physical pages of memory cells with second displacement (NM2) | | -- | -- | I | -- | -- | -- | J | -- | |
| Number of upper physical pages of memory cells with second displacement (NU2) | | -- | K | -- | L | -- | M | -- | N | |
| Total displacement of the lower physical pages: (SNL = NL1 − NL2) | | | | | O | | | | | |
| Total displacement of the middle physical pages: (SNM = NM1 − NM2) | | | P | | | | Q | | | |
| Total displacement of the upper physical pages: (SNU = NU1 − NU2) | | R | | S | T | | | | U | |

FIG. 5

DATA READING METHOD AND STORAGE CONTROLLER

CROSS-REFERENCE TO RELATED APPLICATION

This application claims the priority benefit of Taiwan application serial no. 106133020, filed on Sep. 26, 2017. The entirety of the above-mentioned patent application is hereby incorporated by reference herein and made a part of this specification.

BACKGROUND OF THE INVENTION

1. Field of the Invention

The invention relates to a data reading method, and particularly relates to a data reading method and a storage controller adapted for a storage apparatus having a rewritable non-volatile memory module.

2. Description of Related Art

Generally speaking, when data is being read from a rewritable non-volatile memory module, if a page reading failure does not occur, the system may adopt a preset read voltage set or an optimal read voltage set previously used to read the data. Only when a reading failure occurs may the system (storage system) stop using the preset read voltage set or the previously used optimal voltage and correspondingly adjust the read voltage set.

In other words, values of the optimal read voltage set of the rewritable non-volatile memory module are not fixed. However, the conventional process of adjusting the read voltage set to obtain the optimal read voltage set for data reading is passive. In other words, only when a reading failure occurs may a read voltage set with different voltage values be adopted to perform a plurality of read operations on the data to find out the optimal read voltage set based on the results of the read operations. However, the multiple read operations may significantly affect the efficiency of data reading (e.g., increasing the time of reading the correct data) and reduce the speed of data accessing.

Thus, how to actively find out the optimal read voltage set for the data to be read corresponding to the read operation through calculation before the read operation is performed to eliminate the conventional needs for multiple read operations and reduce the error rate of data reading, thereby improving the reading efficiency of the non-volatile memory module, remains an issue for people having ordinary skills in the art to work on.

SUMMARY OF THE INVENTION

The invention provides a data reading method and a storage controller capable of actively adjusting a plurality of voltages in a preset read voltage set based on information of a physical unit corresponding to a read command in a rewritable non-volatile memory module, so as to obtain an optimal read voltage set. Accordingly, the read command may be effectively executed based on the optimal read voltages of the optimal read voltage set, so as to reduce an error rate of read data.

An embodiment of the invention provides a data reading method adapted for a storage apparatus having a rewritable non-volatile memory module including a plurality of physical units. Each of the physical units includes a plurality of memory cells. The method includes: choosing a first physical unit of the physical units and identifying a plurality of preset bit values of a plurality of first memory cells of the first physical unit, wherein the preset bit values include a plurality of different storage statuses that each of all of the memory cells of the rewritable non-volatile memory module is able to exhibit; reading the first memory cells by respectively using a plurality of preset read voltages of a preset read voltage set, so as to obtain a plurality of read bit values corresponding to the first memory cells, wherein a total number of the preset read voltages is a total number of the storage statuses minus 1, and the preset read voltages are set to respectively distinguish between the storage statuses; adjusting the preset read voltages of the preset read voltage set based on the read bit values and the identified preset bit values corresponding to the first memory cells, so as to obtain an optimized read voltage set; and executing a read command sequence on the first physical unit by using the optimized read voltage set.

An embodiment of the invention provides a storage controller configured to control a storage apparatus having a rewritable non-volatile memory module. The rewritable non-volatile memory module includes a plurality of physical units, and each of the physical units includes a plurality of memory cells. The storage controller includes a connection interface circuit, a memory interface control circuit, and a processor. The connection interface circuit is configured to be coupled to a host system. The memory interface control circuit is configured to be coupled to the rewritable non-volatile memory module. The processor is coupled to the connection interface circuit and the memory interface control circuit. The processor is configured to choose a first physical unit of the physical units and identify a plurality of preset bit values of a plurality of first memory cells of the first physical unit, wherein the preset bit values include a plurality of different storage statuses that each of all of the memory cells of the rewritable non-volatile memory module is able to exhibit. The processor is further configured to read the first memory cells by respectively using a plurality of preset read voltages of a preset read voltage set, so as to obtain a plurality of read bit values corresponding to the first memory cells, a total number of the preset read voltages is a total number of the storage statuses minus 1, and the preset read voltages are set to respectively distinguish between the storage statuses. The processor is further configured to adjust the preset read voltages of the preset read voltage set based on the read bit values and the identified preset bit values corresponding to the first memory cells, so as to obtain an optimized read voltage set. In addition, the processor is further configured to instruct the memory interface control circuit to execute a read command sequence on the first physical unit by using the optimized read voltage set.

Based on the above, in the data reading method and the storage controller according to the embodiments of the invention, the optimized read voltage set may be calculated based on the read bit values and the preset bit values of the memory cells of the physical unit, so as to read data from the physical unit by directly using the optimized read voltage set corresponding to the displacement of the threshold voltage of the physical unit. Accordingly, the accuracy of the read data is reinforced, and the overall efficiency of the read operation is facilitated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a table illustrating calculation of a plurality of total displacements according to an embodiment of the invention.

DESCRIPTION OF THE EMBODIMENTS

Figure 1:
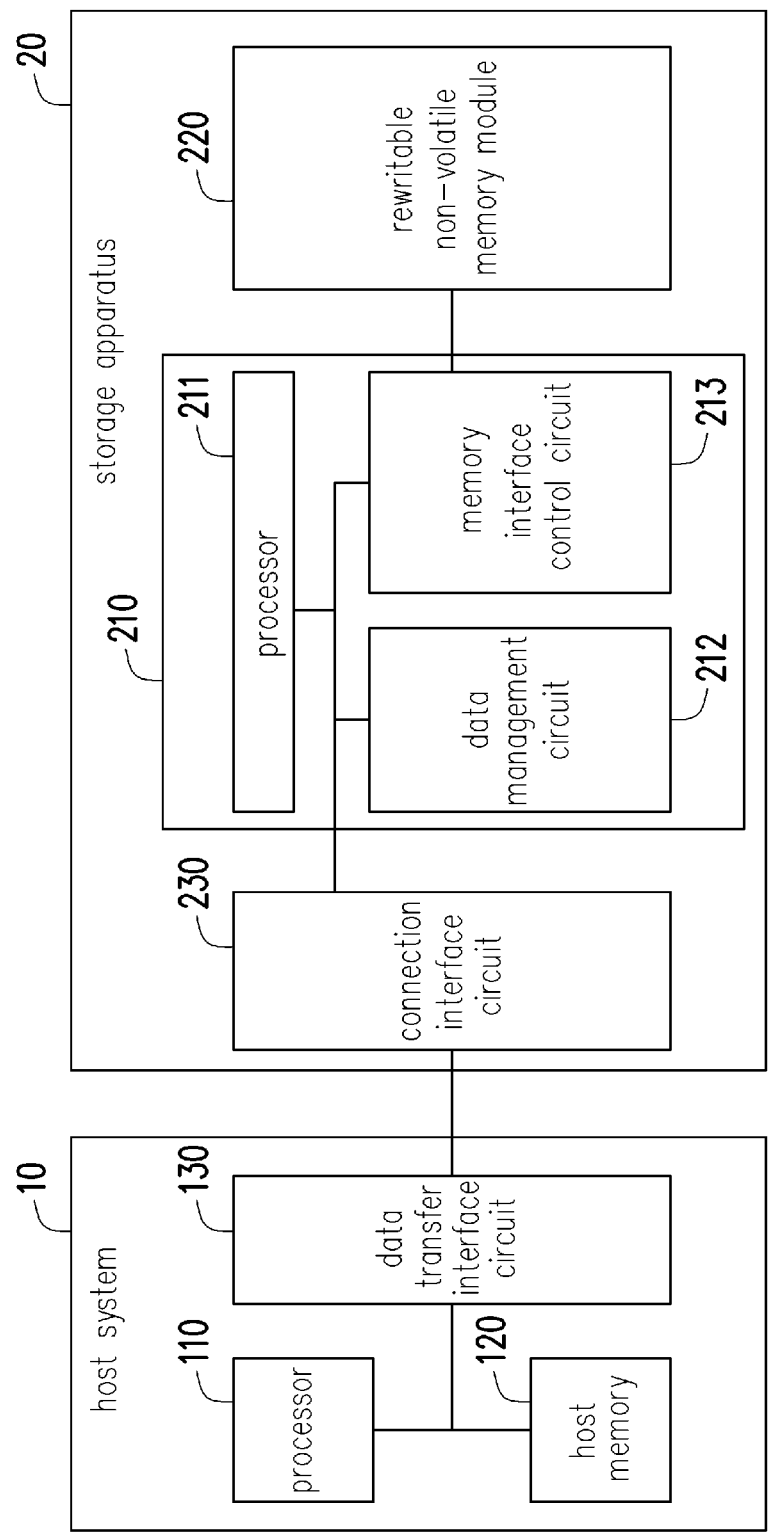
FIG. 1 is a schematic block diagram illustrating a host system and a storage apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In the embodiment, a storage apparatus includes a rewritable non-volatile memory module and a storage apparatus controller (also referred to as a storage controller or a storage control circuit). In addition, the storage apparatus is used with a host system, so that the host system may write data into or read data from the storage apparatus.

FIG. 1 is a schematic block diagram illustrating a host system and a storage apparatus according to an embodiment of the invention.

Referring to FIG. 1, a host system 10 includes a processor 110, a host memory 120, and a data transfer interface circuit 130. In the embodiment, the data transfer interface circuit 130 is coupled to (also referred to as being electrically connected to) the processor 110 and the host memory 120. In another embodiment, the processor 110, the host memory 120, and the data transfer interface circuit 130 are coupled to each other through a system bus.

A storage apparatus 20 includes a storage controller 210, a rewritable non-volatile memory module 220, and a connection interface circuit 230. In addition, the storage controller 210 includes a processor 211, a data management circuit 212, and a memory interface control circuit 213.

In the embodiment, the host system is coupled to the storage apparatus 20 through the data transfer interface circuit 130 and the connection interface circuit 230 of the storage apparatus 20 to carry out a data access operation. For example, the host system 10 may store data to or read data from the storage apparatus 20 through the data transfer interface circuit 130.

In the embodiment, the processor 110, the host memory 120, and the data transfer interface circuit 130 may be disposed on a motherboard of the host system 10. There may be one or more data transfer interface circuits 130. Through the data transfer interface circuit 130, the motherboard may be coupled to the storage apparatus 20 in a wired or wireless manner. The storage apparatus 20 may be a flash drive, a memory stick, a solid state drive (SSD), or a wireless memory storage apparatus. The wireless memory storage apparatus may be a memory storage apparatus compatible with a wireless communication technology, such as a near field communication (NFC) memory storage apparatus, a wireless fidelity (WiFi) memory storage apparatus, a Bluetooth memory storage apparatus, a low-power Bluetooth (e.g., iBeacon) memory storage apparatus, or the like. Besides, the motherboard may also be coupled to various input/output apparatuses, such as a global positioning system (GPS) module, a network interface card, a wireless transmission apparatus, a keyboard, a display, and/or a speaker, through a system bus.

In the embodiment, the data transfer interface circuit 130 and the connection interface circuit 230 are interface circuits compatible with the peripheral component interconnect express (PCI Express) standard. In addition, data transmission between the data transfer interface circuit 139 and the connection interface circuit 230 is based on the non-volatile memory express (NVMe) communication protocol.

However, it should be noted that the invention is not limited thereto. The data transfer interface circuit 130 and the connection interface circuit 230 may also be compatible with the parallel advanced technology attachment (PATA) standard, the Institute of Electrical and Electronic Engineers (IEEE) 1394 standard, the serial advanced technology attachment (SATA) standard, the universal serial bus (USB) standard, the SD interface standard, the ultra high speed-I (UHS-I) interface standard, the ultra high speed-II (UHS-II) interface standard, the memory stick (MS) interface standard, the multi-chip package interface standard, the multimedia card (MMC) interface standard, the eMMC interface standard, the universal flash storage (UFS) interface standard, the eMCP interface standard, the CF interface standard, the integrated device electronics (IDE) standard, or other suitable standards. Besides, in another embodiment, the connection interface circuit 230 and the storage controller 210 may be packaged in one chip. Alternatively, the connection interface circuit 230 may also be disposed external to the chip including the storage controller 210.

In the embodiment, the host memory 120 is configured to temporarily store commands or data executed by the processor 110. For example, in the exemplary embodiment, the host memory 120 may be a dynamic random access memory (DRAM), a static random access memory (SRAM), or the like. However, it should be understood that the invention is not limited thereto. The host memory 120 may also be other suitable memories.

The storage controller 210 is configured to execute a plurality of logic gates or control commands implemented in a hardware form or in a firmware form, and perform various data operations, such as data writing, data reading or data erasing in the rewritable non-volatile memory module 220 according to the commands issued by the host system 10.

More specifically, the processor 211 in the storage controller 210 is a hardware component having a computing capability and is configured to control the overall operation of the storage controller 210. Specifically, the processor 211 has a plurality of control commands. When the storage apparatus 20 operates, the control commands are executed to perform various operations such as data writing, data reading, and data erasing.

It should be noted that, in the embodiment, the processor 110 and the processor 211 are, for example, a central processing unit (CPU), a microprocessor, other programmable microprocessors, a digital signal processor (DSP), a programmable controller, an application specific integrated circuit (ASIC), a programmable logic device (PLD), or other similar circuit components. It should be noted that the invention does not intend to impose a limitation on this regard.

In an embodiment, the storage controller 210 may further include a read-only memory (not shown) and a random access memory (not shown). In addition, the read-only memory has a boot code. When the storage controller 210 is enabled, the processor 211 may execute the boot code to load control commands stored in the rewritable non-volatile memory module 220 into the random access memory of the storage controller 210. Then, the processor 211 may execute the control commands to perform various operations such as data writing, data reading, and data erasing. In another embodiment, the control commands of the processor 211 may also be stored as programming codes in a specific region of the rewritable non-volatile memory module 220. For example, the programming codes may be stored in the physical units of the rewritable non-volatile memory module 220 specifically designated for storage of system data.

In the embodiment, the storage controller 210 further includes the data management circuit 212 and the memory interface control circuit 213. It should be noted that the operations executed by the respective components of the storage controller 220 may also be considered as operations executed by the storage controller 220.

The data management circuit 212 is coupled to the processor 211, the memory interface control circuit 213, and the connection interface circuit 230. The data management circuit 212 is configured to receive instructions from the processor 211 and carry out data transmission. For example, the data transmission includes reading data from the host system 10 (e.g., from the host memory 120) through the connection interface circuit 230, and writing the read data into the rewritable non-volatile memory module 220 through the memory interface control circuit 213 (e.g., performing a write operation based on the write command from the host system 10). As another example, the data transmission includes reading data from one or more physical units of the rewritable non-volatile memory module 220 through the memory interface control circuit 213, and writing the read data to the host system 10 (e.g., the host memory 120) through the connection interface circuit 230 (e.g., performing a read operation based on the read command from the host system 10). In another embodiment, the data management circuit 212 may also be integrated into the processor 211.

The memory interface control circuit 213 is configured to receive an instruction from the processor 211 and work with the data management circuit 212 to perform a write (also referred to as "programming") operation, a read operation, or an erase operation of the rewritable non-volatile memory module 220.

For example, the processor 211 may execute a write command sequence to instruct the memory interface control circuit 213 to write data into the rewritable non-volatile memory module 220, execute a read command sequence to instruct the memory interface control circuit 213 to read data from one or more physical units (also referred to as target physical unit(s)) corresponding to the read command from the rewritable non-volatile memory module 220, or execute an erase command sequence to instruct the memory interface control circuit 213 to perform an erase operation on the rewritable non-volatile memory module 220. Each of the write command sequence, the read command sequence, and the erase command sequence may include one or more programming codes or command codes and is configured to instruct the rewritable non-volatile memory module 220 to carry out various corresponding operations such as a write operation, a read operation, an erase operation, or the like. In an embodiment, the processor 211 may further issue other command sequences to the memory interface control circuit 213 to perform corresponding operations on the rewritable non-volatile memory module 220.

Besides, data to be written to the rewritable non-volatile memory module 220 may be converted into a format acceptable for the rewritable non-volatile memory module 220 through the memory interface control circuit 213. Specifically, if the processor 211 intends to access the rewritable non-volatile memory module 220, the processor 211 may transmit a corresponding command sequence to the memory interface control circuit 213, so as to instruct the memory interface control circuit 213 to perform a corresponding operation. For example, the command sequences may include a write command sequence instructing to write data, the read command sequence instructing to read data, the erase command sequence instructing to erase data, and command sequences instructing to perform various memory operations correspondingly (e.g., changing a plurality of preset read voltage values of a preset read voltage set to perform a read operation, performing a recycling process, or the like). The command sequence may include one or more signals or data on the system bus. The signal or data may include command codes or programming codes. For example, the read command sequence may include information such as a read identification code, a memory address, or the like.

The rewritable non-volatile memory module 220 is coupled to the storage controller 210 (the memory interface control circuit 213), and is configured to store data written by the host system 10. The rewritable non-volatile memory module 220 may be a single level cell (SLC) NAND flash memory module (i.e., a flash memory module where one memory cell stores one bit), a multi level cell (MLC) NAND flash memory (i.e, a flash memory module where one memory cell stores two bits), a triple level cell (TLC) NAND flash memory module (i.e., a flash memory module where one memory cell stores three bits), a three-dimensional (3D) NAND flash memory module, a vertical NAND flash memory module, other flash memory modules, or other memory modules having the same characteristics. Memory cells in the rewritable non-volatile memory module 220 are arranged into an array.

In the embodiment, the memory cells of the rewritable non-volatile memory module 220 may form a plurality of physical programming units, and the physical programming units may form a plurality of physical blocks (also referred to as physical erasing units or physical units). Specifically, memory cells on the same word line (or at the same word line layer) may form one or more physical programming units. In the embodiment, a TLC NAND flash memory is described as an example. Namely, in the following embodiments, a memory cell storing three bit values is considered to be a physical programming unit. In other words, in each programming operation, a programming voltage is applied to program data one programming unit by one programming unit. Besides, each memory cell may be divided into a lower physical page, a middle physical page, and an upper physical page, wherein each of the lower physical page, the middle physical page, and the upper physical page may store one bit value.

In the embodiment, the memory cell is adopted as a minimum unit for data writing (programming). The physical unit is adopted as a minimum unit for erasing. In other words, each physical unit includes a minimum number of memory cells erased together. Each physical unit includes a plurality of memory cells.

It should be noted that, in the embodiment, system data recording the information of a physical unit is recorded in one or more memory cells of the physical unit, or is recorded by one or more memory cells of a specific physical unit, in a system region, for recording all the system data. In the embodiment, the system data corresponding to a physical unit includes a program erase cycle (PEC), a data retention timestamp (DRT), a read counter value, and the like of the physical unit. More specifically, when the processor 211 performs an erase operation on a physical unit, the processor 211 may add one to the program erase cycle currently corresponding to the physical unit after the erase operation is completed. For example, the program erase cycle may accumulate from 0 through each erase operation. In other words, the program erase cycle is able to reflect the total number of erase operations that the corresponding physical unit undergone. The data retention timestamp is configured to indicate the time when data stored in the corresponding physical unit is stored. The size of the timestamp (i.e., difference in numerical value) may serve to indicate a temporal sequence. Nevertheless, it should be noted that the invention does not intend to impose a limitation on details of the timestamp. When a write operation is performed on the physical unit, the processor 211 may update the data retention timestamp of the physical unit as the time when the write operation is performed on the physical unit. In other words, the data retention timestamp corresponding to a physical unit serves to indicate the time at which the latest write operation is performed on the physical unit (e.g., the local time of completing the latest write operation). The write operation includes programming data to one or more memory cells of the physical unit, or programming data to another type of physical address of the physical unit, for example. Then, the processor 211 may calculate how long the data in the physical unit has been stored since the last write operation based on the data retention timestamp. The read counter value serves to calculate the number of times that the corresponding physical unit is read, and the read counter value is reset when the corresponding physical unit is erased.

In the following embodiment, an example where one physical block serves as one physical unit is described. However, in another embodiment, one physical unit may also be formed by an arbitrary number of memory cells, depending on the practical needs. Besides, it should be understood that when the processor 211 groups the memory cells (or physical units) in the rewritable non-volatile memory module 220 to perform a corresponding management operation, the memory cells (or physical units) are logically grouped, while the physical positions of the memory cells remain the same.

For example, in the embodiment, the processor 211 may group a plurality of physical units of the rewritable non-volatile memory module 220 into a plurality of physical unit groups based on statistical values of the physical units. The statistical value includes one of the program erase cycle, the data retention timestamp (also referred to as retention value) and the read counter value or a combination thereof. Physical units grouped into the same physical unit group may share similar physical properties. The processor 211 may perform data reading on the physical units grouped into the same physical unit group based on the same read voltage set. For example, the same read voltage set is adopted to issue the read command sequence to perform the read operation on the physical units of the same physical unit group.

The storage controller 210 may assign a plurality of logical units to the rewritable non-volatile memory module 220. The host system 10 accesses user data stored in the physical units through the logical units. Here, each logical unit may be formed by one or more logical addresses. For example, the logical unit may be a logical block, a logical page, or a logical sector. Each logical unit may be mapped to one or more physical units, wherein the physical unit may include one or more physical addresses, one or more physical sectors, one or more physical programming units, or one or more physical erasing units. In the embodiment, a logical unit is a logical block, and a logical sub-unit is a logical page. Each logical unit includes a plurality of logical sub-units.

Besides, the logical controller 210 is built with a logical to physical address mapping table and a physical to logical address mapping table to record mapping relations between the logical units (e.g., logical blocks, logical pages, and logical sectors) and the physical units (e.g., physical erasing units, physical programming units, and physical sectors) of the rewritable non-volatile memory module 220. In other words, the storage controller 210 may look up a physical unit mapping to a logical unit by referring to the logical to physical address mapping table, and the storage controller 210 may also look up a logical unit mapping to a physical unit by referring to the physical to logical address mapping table. However, it should be noted that the notion of mapping between logical units and physical units is a technical means commonly used by people having ordinary skills in the art, and details in this regard will thus not be repeated in the following.

In an embodiment, the storage controller 210 further includes a buffer memory and a power management circuit. The buffer memory is coupled to the processor 211 and configured to temporarily store data and commands from the host system 10, data or other system data for management of the storage apparatus 20 from the rewritable non-volatile memory module 220. Accordingly, the processor 211 is able to quickly access the data, the commands or the system data from the buffer memory. The power management circuit is coupled to the processor 211 and is configured to control the power of the storage apparatus 20.

In the embodiment, the processor 211 may choose one (also referred to as a first physical unit) of the physical units of the rewritable non-volatile memory module 200 at a specific time point to perform a read voltage optimization operation. In the following, how the read voltage optimization operation and the corresponding data reading method are performed is described in detail with reference to the accompanying drawings.

Figure 2:
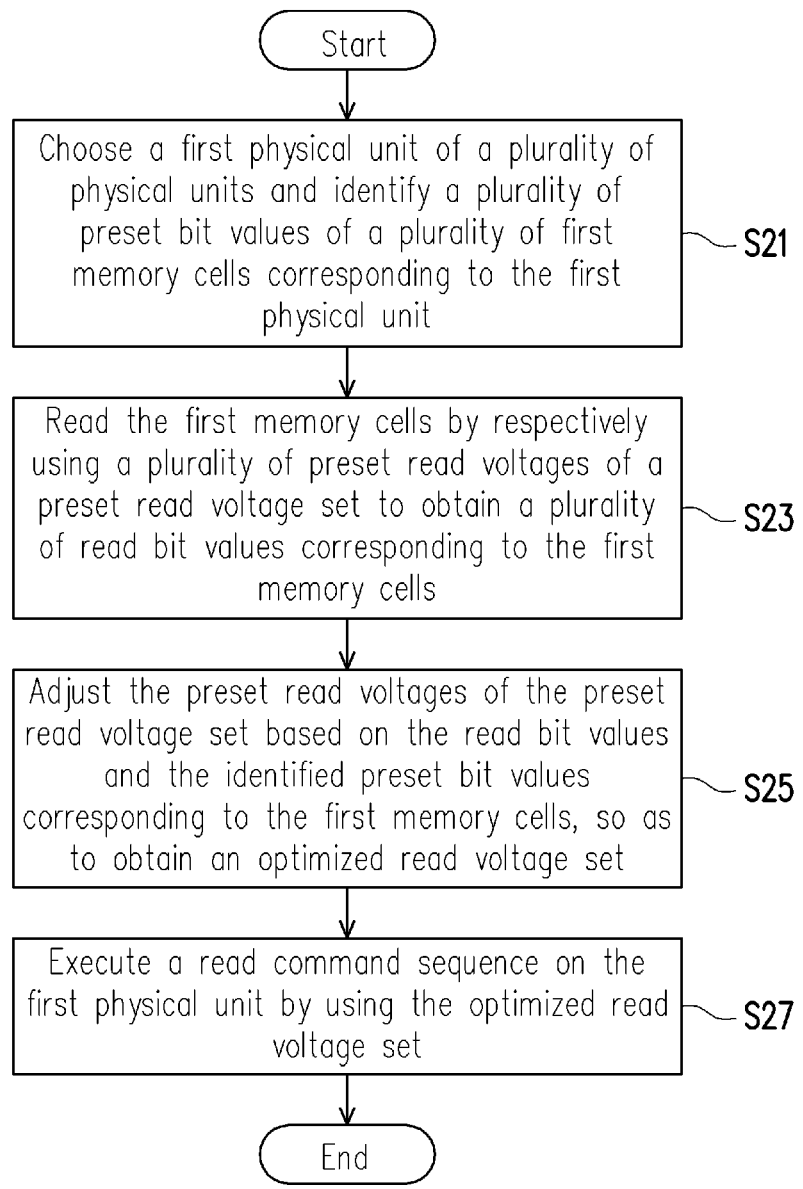
FIG. 2 is a flowchart illustrating a data reading method according to an embodiment of the invention.

FIG. 2 is a flowchart illustrating a data reading method according to an embodiment of the invention. Referring to FIGS. 1 and 2, at Step S21, the processor 21 chooses a first physical unit of a plurality of physical units, and identifies a plurality of preset bit values corresponding to a plurality of first memory cells of the first physical unit.

Specifically, in the embodiment, the processor 211 may actively performs the read voltage optimization operation on the respective physical unit groups that are set. For example, the processor 211 may perform the read voltage optimization operation on each physical unit group when the storage apparatus is idling or turned on. It is assumed that the processor 221 currently performs the read voltage optimization operation on the first physical unit group. The processor 211 may choose the physical unit (the first physical unit) for performing the read voltage optimization operation. The first physical unit may be chosen from the physical units of the first physical unit group based on a preset condition. The preset condition includes one of the physical unit with the minimum read counter value, the physical unit randomly chosen, the physical unit corresponding to a received read command, the physical unit storing preset data (also referred to as validated data) or a combination thereof.

In the embodiment, the preset condition is that the first physical unit stores the preset data. The preset data is stored in the first memory cells in the first physical unit, and the preset data includes the preset bit values. The preset bit values may include a plurality of different storage statuses that each of all of the memory cells of the rewritable non-volatile memory module 220 is able to exhibit (each of the memory cells of the rewritable non-volatile memory module 220 may be programmed one of the different storage statuses). In the following, details of the storage statuses are described with reference to FIG. 4.

Figure 4:
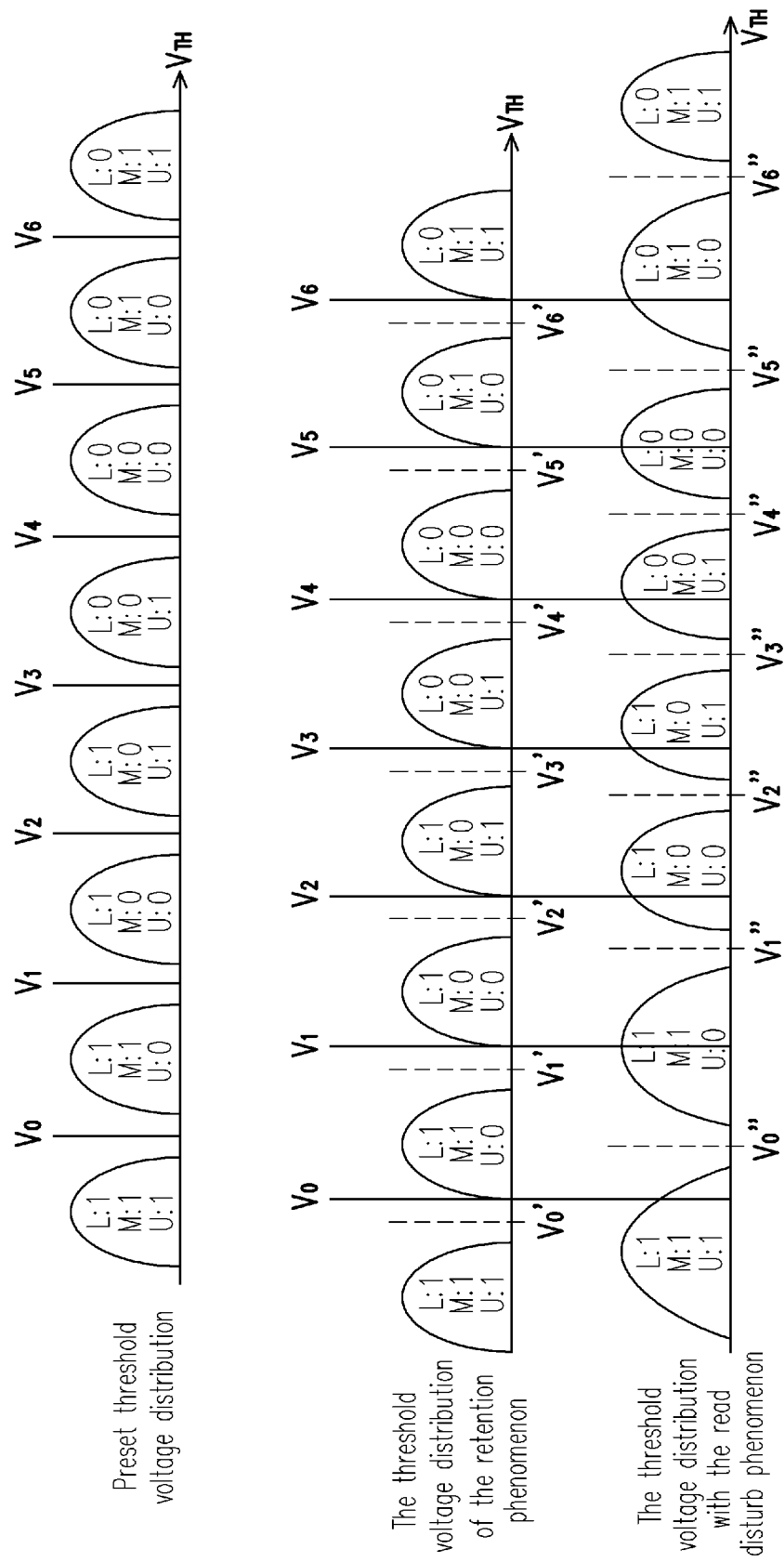
FIG. 4 is a schematic view illustrating threshold voltage distributions and corresponding read voltages in different physical units according to an embodiment of the invention.

FIG. 4 is a schematic view illustrating threshold voltage distributions and corresponding read voltages according to an embodiment of the invention. It is assumed that a threshold voltage distribution of a memory cell in the factory setting is as shown in the upper part of FIG. 4, and the processor 211 is able to accurately determine a (bit) status (also referred to as bit value) stored in the memory cell, i.e., able to determine the data stored in the memory cell, by using preset read voltages $V_0$ to $V_6$ in the preset read voltage set. Referring to the upper part of FIG. 4, in the embodiment, the TLC NAND flash memory module is described as an example. The processor 211 may use seven different read voltage values (i.e., $V_0$ to $V_6$) to read data from the memory cell(s) of the TLC NAND flash memory module. Each memory cell of the TLC NAND flash memory module has three physical pages respectively storing bit data. Each memory cell includes a lower physical page L, a middle physical page M, and an upper physical page U, each storing a bit value. Based on the preset read voltages $V_0$ to $V_6$ in the preset read voltage set, gate voltages of the respective memory cells may be classified into eight storage statuses, i.e., "L:1 M:1 U:1", "L:1 M:1 U:0", "L:1 M:0 U:0", "L:1 M:0 U:1", "L:0 M:0 U:1", "L:0 M:0 U:0", "L:0 M:1 U:0", and "L:0 M:1 U:1", where L represents the bit value of the lower physical page, M represents the bit value of the middle physical page, and U represents the bit value of the upper physical page. In other words, by respectively applying the preset read voltages $V_0$ to $V_6$ with different voltage values in the preset read voltage set to the memory cell, the processor 211 is able to determine the bit value (bit data) of the memory cell to be "111", "110", "100", "101", "001", "000", "010", or "011" based on whether the channel of the memory cell is turned on or not (i.e., reading the read bit value from the memory cell by using the preset read voltage set). For example, the first preset read voltage $V_0$ may serve to distinguish between the storage status "111" and the storage status "110" (as the left of the first preset read voltage $V_0$ corresponds to the threshold voltage distribution of the storage status "111", and the right of the first preset read voltage $V_0$ corresponds to the threshold voltage distribution of the storage status "110"). It should be noted that, compared with the number of the storage statuses that the memory cell of the rewritable non-volatile memory module 220 is able to exhibit (eight in the current example), the number of the preset read voltages is the number of the storage statuses minus 1 (seven in the current example).

Back to FIG. 2, in the embodiment, the preset bit values stored in the first memory cells include all of the storage statuses. The number of the first memory cells is greater than or equal to eight. In other words, the bit values of the preset data (also referred to as the preset system data) stored in the first memory cells include one or more "111", one or more "110", one or more "100", one or more "101", one or more "001", one or more "000", one or more "010", and one or more "011". The preset bit values of the preset data may be set as fixed bit values by the processor 211 in advance. In addition, the processor 211 may write the preset data into the first memory cells of the first physical unit before the read voltage optimization operation is performed. In other words, the processor 211 is informed that the correct bit values of the data (preset data) stored in the first memory cells are the preset bit values. In an embodiment, the preset bit values may be set in advance (and recorded) in the firmware or software for operating the processor 211. In another embodiment, the preset data may also be the user data stored in the first memory cells, and the user data is validated data already decoded.

Referring to the middle part of FIG. 4, after data is written (programmed) to the memory cell and stored for a long time (e.g., no data is written to the memory cell for a long time), the threshold voltage distribution of the memory cell may exhibit a retention phenomenon, where the threshold voltage distribution of the memory cell may be displaced. If the retention timestamp of a physical unit indicates that the data stored in the physical unit is already stored for a long time, the retention phenomenon is likely to occur in the physical unit. In the case that the retention phenomenon occurs, the threshold voltage distribution of the memory cells of the physical unit may be as shown in the middle part of FIG. 4. For example, compared with the preset threshold voltage distribution, the threshold voltage distribution of the memory cells exhibiting the retention phenomenon may be generally displaced toward the left. In such case, if the preset read voltage $V_0$ to $V_6$ in the preset read voltage set are still used to read data from the memory cell (exhibiting the retention effect), the determined bit status of the memory cell may be erroneous (or the number of erroneous bits of the read data may increase). In other words, the processor 211 needs to adjust the preset read voltages $V_0$ to $V_6$ to read voltages $V_0'$ to $V_6'$, so as to accurately read the memory cells exhibiting the retention phenomenon. In other words, as shown in the middle part of FIG. 4, voltage values of the adjusted read voltages $V_0'$ to $V_6'$ (also referred to as optimized read voltages) may be close to the middle line of the interval between each two adjacent threshold voltage distributions, as represented by the dotted lines.

As another example, referring the lower part of FIG. 4, when the memory cell is read multiple times, a read disturb phenomenon may occur in memory cells in adjacency with the read memory cell. In other words, the threshold voltage distribution of the adjacent memory cells may be displaced and/or become more smooth (flat). If the read counter value of a physical unit indicates that the physical unit is already read multiple times (e.g., exceeding a read counter value threshold), the physical unit may exhibit(have/occur) the read disturb phenomenon. If the read disturb phenomenon occurs, the threshold voltage distribution of the memory cells of the physical unit is as shown in the lower part of FIG. 4. For example, compared with the preset threshold voltage distribution, the threshold voltage distribution of the memory cells exhibiting the read disturb phenomenon may be generally displaced toward the right. Hence, if the preset read voltage $V_0$ to $V_6$ in the preset read voltage set are still used to read data from the memory cell (exhibiting the read disturb effect), the determined bit status of the memory cell may be erroneous (or the number of erroneous bits of the read data may increase). In other words, the processor 211 needs to adjust the preset read voltages $V_0$ to $V_6$ to read voltages $V_0''$ to $V_6''$, so as to accurately read the memory cell exhibiting the read disturb phenomenon. As shown in the lower part of FIG. 4, voltage values of the adjusted read voltages $V_0''$ to $V_6''$ (also referred to as optimized read voltages) may be close to the middle line of the interval between each two adjacent threshold voltage distributions, as represented by the dotted lines.

Besides, based on the difference in other statistical values of the physical units (e.g., difference in program erase cycle), the threshold voltage distributions of the memory cells of the physical unit may be correspondingly displaced (changed) from the preset threshold voltage distribution. Since the threshold voltage distribution is displaced, in the data reading method (optimization of the read voltage set) according to an embodiment of the invention, read bit values obtained by reading the first memory cells and the corresponding preset bit values are used to determine a displacement direction and an extent of displacement (displacement size) of the threshold voltage distribution of the first memory cells in correspondence with each preset read voltage, so as to correspondingly adjust the preset read voltages and render the adjusted read voltages as the optimized read voltages (voltages located at the middle between the threshold voltage distributions of two corresponding storage statuses).

For example, at Step S23, the processor 211 reads the first memory cells by respectively using a plurality of preset read voltages of a preset read voltage set, so as to obtain a plurality of read bit values corresponding to the first memory cells. The read bit values are a plurality of bit values obtained by performing a read operation on the first memory cells.

Then, at Step S25, the processor 211 adjusts the preset read voltages of the preset read voltage set based on the read bit values and the identified preset bit values corresponding to the first memory cells, so as to obtain an optimized read voltage set.

Specifically, first of all, the processor 211 may obtain a plurality of total displacements corresponding to the preset read voltages based on the read bit values and the identified preset bit values corresponding to the first memory cells.

Figure 3:
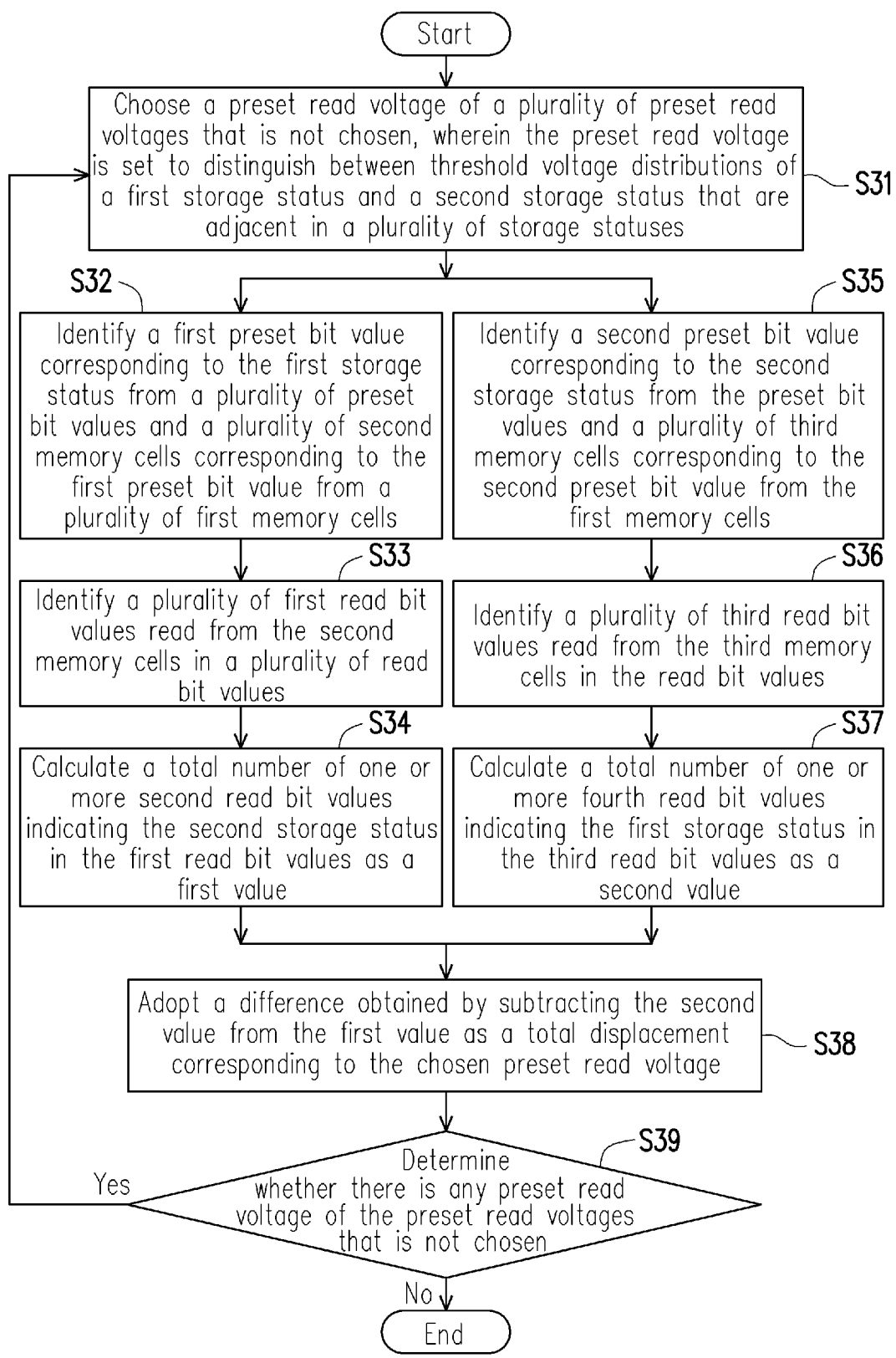
FIG. 3 is a flowchart illustrating calculation a plurality of total displacements corresponding to a plurality of preset read voltages according to an embodiment of the invention.
Figure 6A:
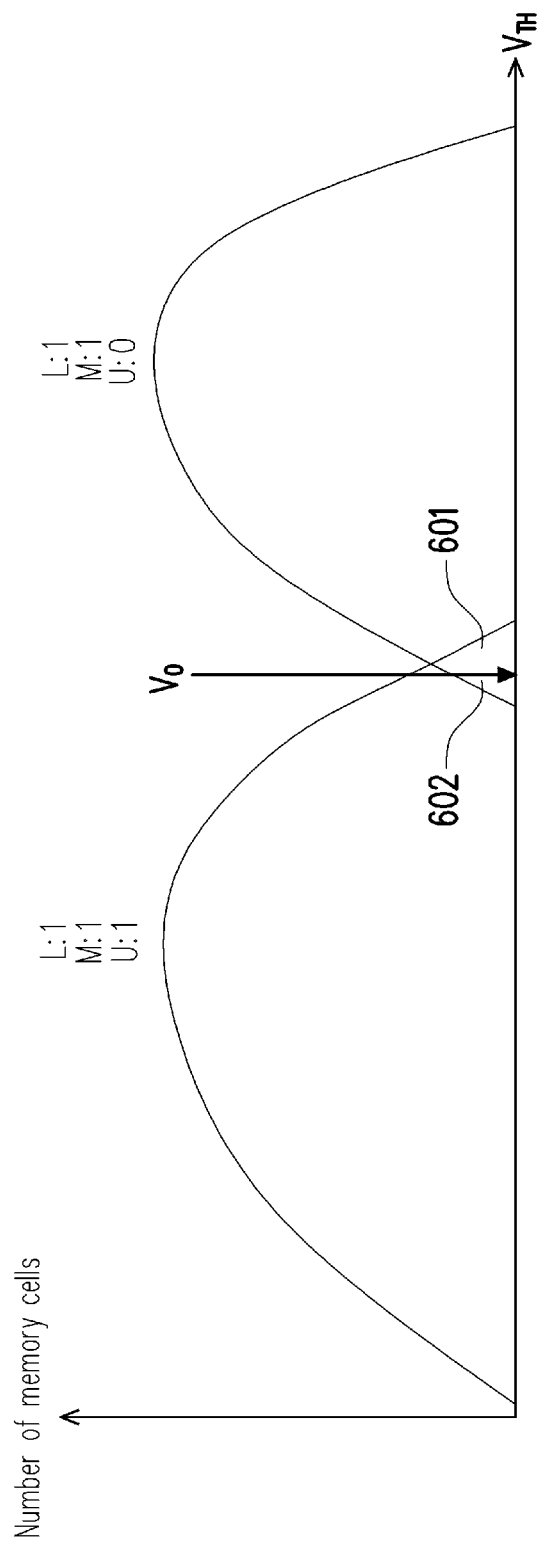
FIGS. 6A to 6C are schematic views illustrating calculation of total displacements corresponding to preset read voltages according to an embodiment of the invention.
Figure 6B:
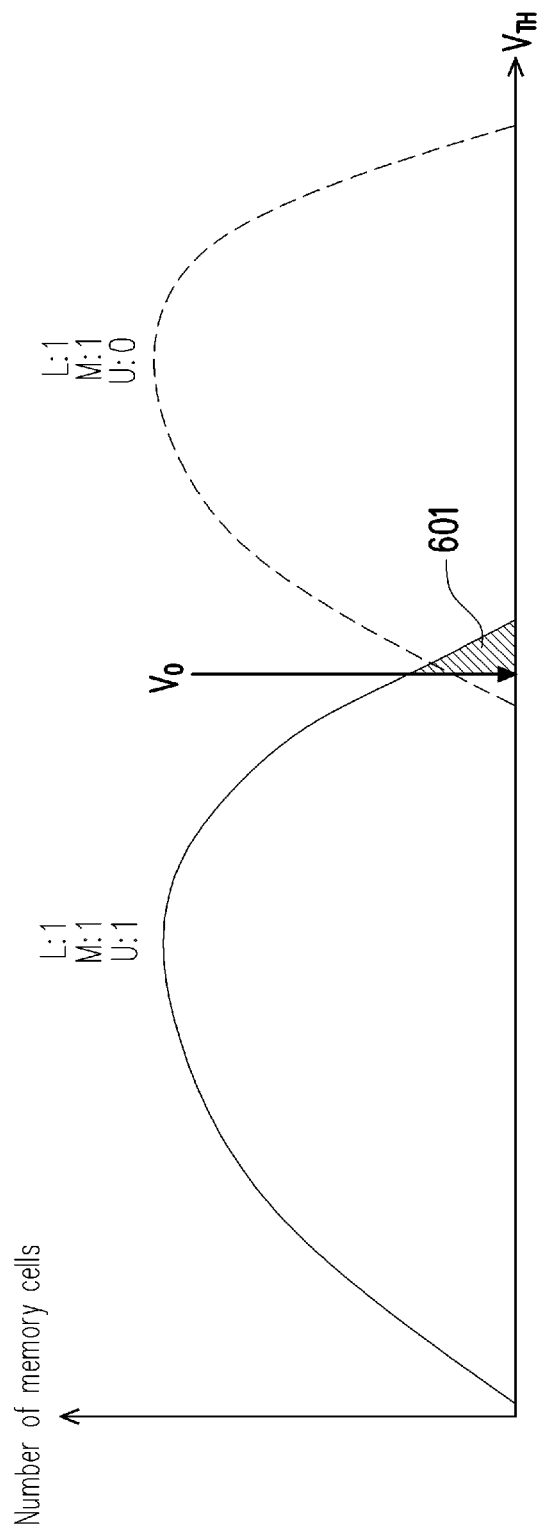
Figure 6C:
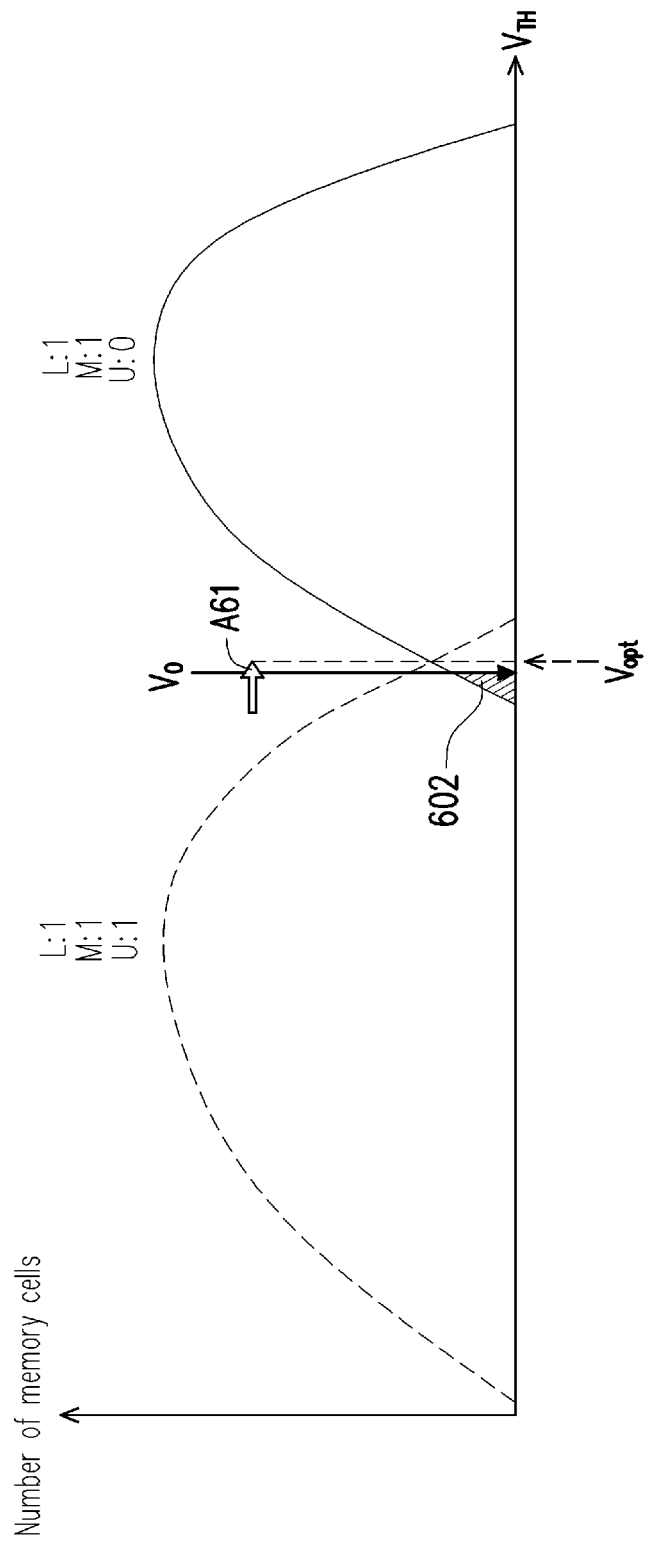

FIG. 3 is a flowchart illustrating calculation of a plurality of total displacements corresponding to a plurality of preset read voltages according to an embodiment of the invention. FIGS. 6A to 6C are schematic views illustrating calculation of total displacements corresponding to preset read voltages according to an embodiment of the invention.

In the embodiment, the processor 211 may perform an optimization (correction) operation on each preset read voltage in the preset read voltage set. Referring to FIG. 3, at Step S31, the processor 211 chooses a preset read voltage of the preset read voltages that is not chosen. The preset read voltage is set to distinguish between the threshold voltage distributions of a first storage status and a second storage status that are adjacent in a plurality of storage statuses. Specifically, the processor 211 may choose one or more preset read voltages that are not chosen from the preset read voltages $V_0$ to $V_6$ of the preset read voltage set. Referring to FIG. 6A, it is assumed that the processor 211 chooses the first preset read voltage $V_0$ to distinguish between the adjacent storage statuses, such as the first storage status "111" (i.e., L:1 M:1 U:1) and the second storage status "110" (i.e., L:1 M:1 U:0"). In other words, the processor 211 performs the read operation on the memory cells by using the first preset read voltage $V_0$ to determine whether the bit values of the memory cells are "111" or "110". The bit value of a memory cell may be determined by the bit values of the upper, middle, and lower physical pages of the memory cell.

At Step S32, the processor 211 identifies a first preset bit value corresponding to the first storage status from a plurality of preset bit values and a plurality of second memory cells corresponding to the first preset bit value from the first memory cells. Specifically, since the first memory cells and the corresponding preset values are set in advance, the processor 211 is able to identify the memory cells and the numbers of the memory cells corresponding to different storage statuses (preset bit values). It is assumed that there are Z first memory cells and Z first preset bit values. The bit value indicating the first storage status is referred to as the first preset bit value (e.g., "111"). In the example, the first memory cells whose preset bit value is (or corresponds to) the first preset bit value are referred to as the second memory cells, and the number of the second memory cells is M (i.e., M first preset bit values in Z preset bit values). Referring to FIG. 6B, a hill-like threshold voltage distribution region on the left indicates the threshold voltage distribution of the second memory cells with the first preset bit value ("111"). Ideally, if the threshold voltage distribution of the second memory cells is not displaced, the threshold voltage distribution of the second memory cells may be located on the left of the first preset read voltage $V_0$, and the bit value of the second memory cells may be "111".

Then, at Step S33, the processor 211 identifies a plurality of first read bit values read from the second memory cells in a plurality of read bit values. Specifically, the processor 211 obtains the read bit values of the first memory cells at Step S23. Then, the processor 211 may identify the first read bit values read from the second memory cells. In other words, the processor 211 may identify whether the read bit values of the second memory cells actually indicate the first storage status or the second storage status based on the read bit values of the second memory cells. For example, as shown in FIG. 6B, the threshold voltages of a part of second memory cells 601 (e.g., those in the region in oblique lines shown in FIG. 6B) of the second memory cells are located on the right of the first preset read voltage. In other words, the read bit values of the part of second memory cells 601 are determined to be in the second storage status "110", instead of the first storage status "111" corresponding to the second memory cells.

Then, at Step S34, the processor 211 calculates a total number of one or more second read bit values indicating the second storage status in the first read bit values as a first value. For example, referring to FIG. 6B, according to the first read bit values, the processor 211 calculates the total number of the second read bit values indicating the second storage status "110" in the first read bit values. Here, it is assumed that the first value is 3X. In other words, the first value may represent the number of the read bit values that are expected indicate the first storage status (e.g., the preset bit value indicates the first storage status) but indicate the second storage status. The first value may also indicate the number of memory cells that are erroneously determined (expected to correspond to the same preset read voltage) to indicate the adjacent second storage status based on the preset read voltage (i.e., the read bit value obtained through the read operation based on the preset read voltage indicates the adjacent second storage status) when the threshold voltage distribution is displaced.

The processor 211 may also carry out Steps S35 to S37 at the same time when Steps S32 to S34 are executed. Similar to Steps S32 to S34, at Step S35, the processor 211 identifies a second preset bit value corresponding to the second storage status from the preset bit values and a plurality of third memory cells corresponding to the second preset bit value from the first memory cells. For example, referring to FIG. 6C, a hill-like threshold voltage distribution region on the right indicates the threshold voltage distribution of the third memory cells with the second preset bit value ("110"). Ideally, if the threshold voltage distribution of the third memory cells is not displaced, the threshold voltage distribution of the third memory cells may be located on the right of the first preset read voltage $V_0$, and the bit value of the third memory cells may be "110".

Then, at Step S36, the processor 211 identifies a plurality of third read bit values read from the third memory cells in the read bit values. Specifically, the processor 211 may identify the third read bit values from the third memory cells based on the obtained read bit values. In other words, the processor 211 may identify whether the read bit values of the third memory cells actually indicate the second storage status or the first storage status based on the read bit values of the third memory cells. For example, as shown in FIG. 6C, the threshold voltages of a part of the third memory cells 602 of the third memory cells (e.g., those in the region in oblique lines shown in FIG. 6C) are located on the left of the first preset read voltage. In other words, the read bit values of the part of the third memory cells 602 are determined to be in the first storage status "111", instead of the second storage status "110" corresponding to the third memory cells.

Then, at Step S37, the processor 211 calculates a total number of one or more fourth read bit values indicating the first storage status in the third read bit values as a second value. For example, referring to FIG. 6C, according to the third read bit values, the processor 211 calculates the total number of the fourth read bit values indicating the first storage status "111" in the third read bit values. Here, it is assumed that the second value is X. In other words, the second value may represent the number of the read bit values that are expected to indicate the second storage status (e.g., the preset bit value indicates the second storage status) but indicate the first storage status. The second value may also indicate the number of memory cells that are erroneously determined (expected to correspond to the same preset read voltage) to indicate the adjacent first storage status through the preset read voltage (i.e., the read bit value obtained through the read operation based on the preset read voltage indicates the adjacent first storage status rather than the preset second storage status) when the threshold voltage distribution is displaced. In an embodiment, the first value and the second value may be referred to as a grey code displacement of the first preset read voltage.

After calculating the first value (also referred to as a positive displacement) and the second value (also referred to as a negative displacement, at Step S38, the processor 211 adopts a difference obtained by subtracting the second value from the first value as the total displacement corresponding to the chosen preset read voltage. The total replacement may serve to indicate the direction and the extent (degree) of the displacement of the threshold voltage distributions corresponding to the first preset read voltage. In an embodiment, the total displacement may be referred to as an overall grey code displacement corresponding to the first preset read voltage.

For example, referring to FIGS. 6B and 6C, the number (first value) of the part of the second memory cells 601 whose preset bit value is "111" but read bit value is "110" is 3X, and the number (second value) of the part of the third memory cells 602 whose preset bit value is "110" but the read bit value is "111" is X. The first value is greater than the second value (the total replacement is 2X and is positive), and the area of the part of the memory cells 601 is greater than the area of the part of the memory cells 602. The example/phenomenon indicates that the threshold voltage distributions of the two storage statuses "111" and "110" corresponding to the first preset read voltage $V_0$ are displaced (toward the direction of the second storage status) toward a positive voltage direction (the total replacement is positive). In other words, the storage status of some memory cells whose storage status should be "111" is displaced to "110". Accordingly, the first preset read voltage $V_0$ should be adjusted toward the positive voltage direction (e.g., toward the direction of the second storage status, as indicated by an arrow sign A61), so that the first preset read voltage $V_0$ may be moved toward a cross point where the threshold voltage distributions overlap (i.e., the optimal point) to set an optimal read voltage $V_{OPT}$.

Accordingly, the calculation of the total displacement of the first preset read voltage $V_0$ chosen to distinguish the first storage status "111" and the second storage status "110" is completed. Then, at Step S39, the processor 211 determines whether there is still any preset read voltage of the preset read voltages that is not chosen. In other words, if there is still a preset read voltage not chosen (Yes→at Step S39), the processor 201 may return to Step S31 to choose the preset read voltage and correspondingly carry out the calculation of the total displacement corresponding to the newly chosen preset read voltage. If all of the preset read voltages in the preset read voltage set are already chosen (and the corresponding total displacements are calculated) (No→at Step S39), the operation that the processor 211 obtains the total displacements respectively corresponding to the preset read voltages based on the read bit values and the identified preset bit values corresponding to the first memory cells is completed. In the following, descriptions from another perspective are made with reference to FIG. 5.

FIG. 5 is a table illustrating calculation of a plurality of total displacements according to an embodiment of the invention. Referring to FIG. 5, in the embodiment, the processor 211 may sort the threshold voltage displacements and the total displacements of the corresponding memory cells (the first memory cells) by compiling a table such as a table 50. Here, the preset bit values may be identified from the memory cells, and the read bit values are obtained through the read operation. As described above, the storage statuses S1 to S8 of the bit values corresponding to the different physical pages (upper, middle, and lower physical pages) of the memory cells may be classified into "111", "110", "100", "101", "001", "000", "010", and "011" based on the preset read voltages.

It is assumed that a direction of a first displacement (also referred to as a positive displacement) is the positive voltage direction (e.g., rightward "→"), and a direction of a second displacement (also referred to as a negative displacement) is the negative voltage direction (e.g., leftward "←").

In the embodiment, it is assumed that the processor 211 already calculates the following numbers(values) based on the data reading method: "D" as the number of memory cells whose storage status is expected to be "111" but is actually "110" due to the first displacement (i.e., the number NU1 of memory cells whose storage status is displaced from the storage status S1 to the storage status S2 is D); "B" as the number of memory cells whose storage status is expected to be "110" but is actually "100" due to the first displacement (i.e., the number NM1 of memory cells whose storage status is displaced from the storage status S2 to the storage status S3 is B); "E" as the number of memory cells whose storage status is expected to be "100" but is actually "101" due to the first displacement (i.e., the number NU1 of memory cells whose storage status is displaced from the storage status S3 to the storage status S4 is E); "A" as the number of memory cells whose storage status is expected to be "101" but is actually "001" due to the first displacement (i.e., the number NL1 of memory cells whose storage status is displaced from the storage status S4 to the storage status S5 is A); "F" as the number of memory cells whose storage status is expected to be "001" but is actually "000" due to the first displacement (i.e., the number NU1 of memory cells whose storage status is displaced from the storage status S5 to the storage status S6 is F); "C" as the number of memory cells whose storage status is expected to be "000" but is actually "010" due to the first displacement (i.e., the number NM1 of memory cells whose storage status is displaced from the storage status S6 to the storage status S7 is C); and "G" as the number of memory cells whose storage status is expected to be "010" but is actually "011" due to the first displacement (i.e., the number NU1 of memory cells whose storage status is displaced from the storage status S7 to the storage status S8 is G). In other words, the numbers D, B, E, A, F, C, and G are the first values(numbers) respectively corresponding to the preset read voltages $V_0$ to $V_6$.

Besides, in the embodiment, it is assumed that the processor 211 already calculates the following numbers(values): "K" as the number of memory cells whose storage status is expected to be "110" but is actually "111" due to the second displacement (i.e., the number NU2 of memory cells whose storage status is displaced from the storage status S2 to the storage status S1 is K); "I" as the number of memory cells whose storage status is expected to be "100" but is actually "110" due to the second displacement (i.e., the number NM2 of memory cells whose storage status is displaced from the storage status S3 to the storage status S2 is I); "L" as the number of memory cells whose storage status is expected to be "101" but is actually "100" due to the second displacement (i.e., the number NU2 of memory cells whose storage status is displaced from the storage status S4 to the storage status S3 is L); "H" as the number of memory cells whose storage status is expected to be "001" but is actually "101" due to the second displacement (i.e., the number NL2 of memory cells whose storage status is displaced from the storage status S5 to the storage status S4 is H); "M" as the number of memory cells whose storage status is expected to be "000" but is actually "010" due to the second displacement (i.e., the number NU2 of memory cells whose storage status is displaced from the storage status S6 to the storage status S5 is M); "J" as the number of memory cells whose storage status is expected to be "010" but is actually "000" due to the second displacement (i.e., the number NM2 of memory cells whose storage status is displaced from the storage status S7 to the storage status S6 is J); and "N" as the number of memory cells whose storage status is expected to be "011" but is actually "010" due to the second displacement (i.e., the number NU2 of memory cells whose storage status is displaced from the storage status S8 to the storage status S7 is N). In other words, the numbers K, I, L, H, M, J, and N are the second values(numbers) respectively corresponding to the preset read voltages $V_0$ to $V_6$.

Lastly, the processor 211 may calculate total displacements R, P, S, O, T, Q, and U respectively corresponding to the preset read voltages $V_0$ to $V_6$ based on the first values and the second values respectively corresponding to the preset read voltages $V_0$ to $V_6$ (e.g., R=D−K) and may adjust the preset read voltages $V_0$ to $V_6$ based on the total displacements R, P, S, O, T, Q, and U respectively corresponding to the preset read voltages $V_0$ to $V_6$. A positive total displacement indicates that most of the memory cells (lower, middle, or upper physical page) corresponding to the total displacement are displaced in the direction of the first displacement (i.e., most of the memory cells have positive displacement). Alternatively, a negative total displacement indicates that most of the memory cells (lower, middle, or upper physical page) corresponding to the total displacement is displaced in the direction of the second displacement (i.e., most of the memory cells have negative displacement). The corresponding preset read voltage is adjusted in correspondence with the direction of total displacement. For example, if most of the memory cells have the positive displacement, the preset read voltage should be adjusted toward the positive voltage direction.

After obtaining the total displacements respectively corresponding to the preset read voltages, the processor 211 may calculate a plurality of displacement voltages respectively corresponding to the preset read voltages of the preset read voltage set based on the total displacements of the preset read voltages. Specifically, in the embodiment, for each of the total displacements, the processor 211 may identify a standardization constant corresponding to the total displacement from a plurality of standardization constants based on the total displacement and a plurality of displacement thresholds, and multiply a unit displacement voltage and a quotient obtained by dividing the total displacement by the identified standardization constant, thereby obtaining the displacement voltage corresponding to the total displacement.

Taking the above case as an example, the total displacement corresponding to the first preset read voltage $V_0$ is 2X. The displacement thresholds are respectively P and Q, wherein Q is greater than P. The standardization constants are p, q, and r, wherein r is greater than q, and q is greater than p. The processor 211 may compare the total displacement 2X with the displacement thresholds P and Q. If the total displacement 2X is greater than the displacement threshold Q, the processor 211 may identify that the total displacement 2X corresponds to the standardization constant r. If the total displacement 2X is less than the displacement threshold P, the processor 211 may identify that the total displacement 2X corresponds to the standardization constant p. If the total displacement 2X is between the displacement thresholds Q and P, the processor 211 may identify that the total displacement 2X corresponds to the standardization constant q. In the factory setting, the number and the values of the displacement thresholds and the number and the values of the standardization constants may be set based on the properties of the rewritable non-volatile memory module 220. It should be noted that the table 50 merely provides an example for sorting/calculating the total displacements. People having ordinary skills in the art may make improvement without departing from the principle of the table (e.g., obtaining the displacement of each preset read voltage by using other methods to calculate the displacements of threshold voltage distributions), so as to sort and compute based on the threshold voltage distribution of the memory cells whose preset bit values are identifiable in the physical unit currently involved in the optimization operation of the read voltage set. Accordingly, the total displacements corresponding to the preset read voltage are calculated, and the calculated total replacements are then applied to calculate the optimized read voltage set of the physical unit.

In the embodiment, after the standardization constant corresponding to the total displacement is identified, the processor 211 may divide the total displacement by the corresponding standardization constant and multiply the quotient obtained accordingly and the unit displacement voltage to obtain the displacement voltage corresponding to the total displacement. In the factory setting, the unit displacement voltage may be set based on the properties of the rewritable non-volatile memory module 220. In the same light, after calculating the total displacements corresponding to different preset read voltages, the processor 211 may calculate the corresponding displacement voltages based on the total displacements corresponding to different preset read voltages. It should be noted that, in another embodiment, the unit displacement voltage value may be determined based on one or more statistical values of the first physical unit. For example, assuming that the total displacements of two physical units are the same, and the number of program erase cycle of one of the physical units is greater than that of the other, the unit displacement voltage adopted for the one of the physical units may be different from the unit displacement voltage adopted for the other. In other words, the calculated displacement voltage corresponding to the physical unit may differ from the displacement voltage corresponding to another physical unit. Namely, in addition to obtaining the direction and the extent of displacement of the threshold voltage based on the total displacement, thereby obtaining the displacement voltage, one or more statistical values (e.g., the retention timestamp/retention time, the read counter value, the number of program erase cycle, or the like) about the physical unit itself may also be taken into consideration during calculation of the displacement voltage.

It should be noted that, in an embodiment, if the total displacement corresponding to a preset read voltage is less than a preset value (such as 21, i.e., the total displacement is within a range from 1 to 20), or the total displacement is zero, the processor 211 may refrain from adjusting the preset read voltage (the voltage value of the preset read voltage is considered to be the optimized read voltage). In other words, the processor 211 may refrain from calculating the displacement voltage corresponding to the total displacement. The preset value is less than the minimum of the displacement thresholds. The preset value may be adjusted based on the statistical value (e.g., the retention value or the program erase cycle) of the physical unit group or based on the error checking and correcting ability with respect to the read data.

After the displacement voltages respectively corresponding to the preset read voltages are calculated, the processor 211 may add the corresponding displacement voltages to the preset read voltages in the preset read voltage set to obtain the optimized read voltages of the optimized read voltage set. Namely, according to the embodiment, the processor 211 may actively obtain the optimized read voltage set for a physical unit based on the read bit values and the preset bit values of the memory cells of the physical unit.

Referring to FIG. 2, after obtaining the optimized read voltage set, the processor 211 executes the read command sequence on the first physical unit by using the optimized read voltage set at Step S27. In other words, the first physical unit whose threshold voltage distributions are already displaced may be read by using the optimized read voltages in the optimized read voltage set.

For example, when the processor 211 receives the read command from the host system 10, the processor 211 may obtain the logical address storing the target data based on the read command, and obtain the physical address storing the target data in the rewritable non-volatile memory module 220 based on the logical to physical address mapping table. Then, based on the physical address, the processor 211 may identify the physical unit with the physical address, and execute the read command sequence corresponding to the read command by using the optimized read voltage set corresponding to the physical unit, so as to read data by using the corresponding optimized read voltage set based on the displacement of the threshold voltage distributions of the physical unit.

In view of the foregoing, in the data reading method and the storage controller according to the embodiments of the invention, the optimized read voltage set may be calculated based on the read bit values and the preset bit values of the memory cells of the physical unit, so as to read data from the physical unit by directly using the optimized read voltage set corresponding to the displacement of the threshold voltage of the physical unit. Accordingly, the accuracy of the read data is reinforced, and the overall efficiency of the read operation is facilitated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data reading method, adapted for a storage apparatus having a rewritable non-volatile memory module comprising a plurality of physical units, wherein each of the physical units comprises a plurality of memory cells, and the method comprises:

choosing a first physical unit of the physical units and identifying a plurality of preset bit values of a plurality of first memory cells of the first physical unit, wherein the preset bit values comprise a plurality of different storage statuses that each of all of the memory cells of the rewritable non-volatile memory module is able to exhibit;

reading the first memory cells by respectively using a plurality of preset read voltages of a preset read voltage set, so as to obtain a plurality of read bit values stored in the first memory cells, wherein a total number of the preset read voltages is a total number of the storage statuses minus 1, and the preset read voltages are set to respectively distinguish between the storage statuses;

adjusting the preset read voltages of the preset read voltage set based on the read bit values and the identified preset bit values corresponding to the first memory cells, so as to obtain an optimized read voltage set; and executing a read command sequence on the first physical unit by using the optimized read voltage set, wherein the step of adjusting the preset read voltages of the preset read voltage set based on the read bit values and the identified preset bit values corresponding to the first memory cells to obtain an optimized read voltage set comprises:

obtaining a total displacement corresponding to one of preset read voltages based on the read bit values and the identified preset bit values corresponding to the first memory cells;

multiplying a unit displacement voltage and a quotient obtained according to the total displacement and a standardization constant to obtain the displacement voltage of the total displacement; and obtaining one optimized read voltage corresponding to the said one preset read voltage among a plurality of optimized read voltages of the optimized read voltage set by adding the displacement voltage to the said one preset read voltage.

2. The data reading method as claimed in claim 1, wherein obtaining the total displacements respectively corresponding to the preset read voltages based on the read bit values and the identified preset bit values corresponding to the first memory cells comprises:

choosing a preset read voltage of the preset read voltages that is not chosen, wherein the preset read voltage is set to distinguish between threshold voltage distributions of a first storage status and a second storage status that are adjacent in the storage statuses;

identifying a first preset bit value corresponding to the first storage status from the preset bit values and a plurality of second memory cells corresponding to the first preset bit value from the first memory cells;

identifying a plurality of first read bit values read from the second memory cells in the read bit values;

calculating a total number of one or more second read bit values indicating the second storage status in the first read bit values as a first value;

identifying a second preset bit value corresponding to the second storage status from the preset bit values and a plurality of third memory cells corresponding to the second preset bit value from the first memory cells;

identifying a plurality of third read bit values read from the third memory cells in the read bit values;

calculating a total number of one or more fourth read bit values indicating the first storage status in the third read bit values as a second value; and adopting a difference obtained by subtracting the second value from the first value as the total displacement corresponding to the chosen preset read voltage.

3. The data reading method as claimed in claim 1, wherein multiplying the unit displacement voltage and the quotient obtained according to the total displacement and the standardization constant to obtain the displacement voltage of the total displacement comprises:

for each total displacement of the total displacements, identifying the standardization constant corresponding to the total displacement from a plurality of standardization constants based on the total displacement and a plurality of displacement thresholds; and multiplying the unit displacement voltage and the quotient obtained by dividing the total displacement by the identified standardization constant, so as to obtain the displacement voltage of the total displacement.

4. The data reading method as claimed in claim 1, further comprising:

grouping the physical units of the rewritable non-volatile memory module into a plurality of physical unit groups based on a statistical value of the physical units, wherein the first physical unit is grouped into a first physical unit group of the physical unit groups, and the statistical value comprises one of a program erase cycle, a read counter value, and a retention value or a combination thereof; and executing another read command sequence on other one or more second physical units in the first physical unit group by using the optimized read voltage set.

5. A storage controller, configured to control a storage apparatus having a rewritable non-volatile memory module, wherein the storage controller comprises:

a connection interface circuit, configured to be coupled to a host system;

a memory interface control circuit, configured to be coupled to the rewritable non-volatile memory module, wherein the rewritable non-volatile memory module comprises a plurality of physical units, and each of the physical units comprises a plurality of memory cells; and a processor, coupled to the connection interface circuit and the memory interface control circuit, wherein the processor is configured to choose a first physical unit of the physical units and identify a plurality of preset bit values of a plurality of first memory cells of the first physical unit, wherein the preset bit values comprise a plurality of different storage statuses that each of all of the memory cells of the rewritable non-volatile memory module is able to exhibit;

wherein the processor is further configured to read the first memory cells by respectively using a plurality of preset read voltages of a preset read voltage set, so as to obtain a plurality of read bit values corresponding to the first memory cells, a total number of the preset read voltages is a total number of the storage statuses minus 1, and the preset read voltages are set to respectively distinguish between the storage statuses;

wherein the processor is further configured to adjust the preset read voltages of the preset read voltage set based on the read bit values and the identified preset bit values corresponding to the first memory cells, so as to obtain an optimized read voltage set; and wherein the processor is further configured to instruct the memory interface control circuit to execute a read command sequence on the first physical unit by using the optimized read voltage set, wherein in the operation of adjusting the preset read voltages of the preset read voltage set based on the read bit values and the identified preset bit values corresponding to the first memory cells to obtain an optimized read voltage set, the processor obtains a total displacement corresponding to one of preset read voltages based on the read bit values and the identified preset bit values corresponding to the first memory cells, the processor multiplies a unit displacement voltage and a quotient obtained according to the total displacement and a standardization constant to obtain the displacement voltage of the total displacement, and the processor obtains one optimized read voltage corresponding to the said one preset read voltage among a plurality of optimized read voltages of the optimized read voltage set by adding the displacement voltage to the said one preset read voltage.

6. The storage controller as claimed in claim 5, wherein in an operation that the processor obtains the total displacements respectively corresponding to the preset read voltages based on the read bit values and the identified preset bit values corresponding to the first memory cells, the processor chooses a preset read voltage of the preset read voltages that is not chosen, wherein the preset read voltage is set to distinguish between threshold voltage distributions of a first storage status and a second storage status that are adjacent in the storage statuses, wherein the processor identifies a first preset bit value corresponding to the first storage status from the preset bit values and a plurality of second memory cells corresponding to the first preset bit value from the first memory cells, wherein the processor identifies a plurality of first read bit values read from the second memory cells in the read bit values, wherein the processor calculates a total number of one or more second read bit values indicating the second storage status in the first read bit values as a first value, wherein the processor identifies a second preset bit value corresponding to the second storage status from the preset bit values and a plurality of third memory cells corresponding to the second preset bit value from the first memory cells, wherein the processor identifies a plurality of third read bit values read from the third memory cells in the read bit values, wherein the processor calculates a total number of one or more fourth read bit values indicating the first storage status in the third read bit values as a second value, and wherein the processor adopts a difference obtained by subtracting the second value from the first value as the total displacement corresponding to the chosen preset read voltage.

7. The storage controller as claimed in claim 5, wherein in an operation that the processor multiplies the unit displacement voltage and the quotient obtained according to the total displacement and the standardization constant to obtain the displacement voltage of the total displacement, for each total displacement of the total displacements, the processor identifies the standardization constant corresponding to the total displacement from a plurality of standardization constants based on the total displacement and a plurality of displacement thresholds, and wherein the unit displacement voltage and the quotient obtained by dividing the total displacement by the identified standardization constant, so as to obtain the displacement voltage of the total displacement.

8. The storage controller as claimed in claim 5, wherein the processor groups the physical units of the rewritable non-volatile memory module into a plurality of physical unit groups based on a statistical value of the physical units, the first physical unit is grouped into a first physical unit group of the physical unit groups, and the statistical value comprises one of a program erase cycle, a read counter value, and a retention value or a combination thereof; and wherein the processor executes another read command sequence on other one or more second physical units in the first physical unit group by using the optimized read voltage set.

* * * * *